United States Patent [19]
Anderson et al.

[11] Patent Number: 5,999,386
[45] Date of Patent: *Dec. 7, 1999

[54] CROSS-REFERENCED ELECTROSTATIC DISCHARGE PROTECTION SYSTEMS AND METHODS FOR POWER SUPPLIES

[75] Inventors: Warren Robert Anderson, Westborough; Nicholas John Howorth, Northborough, both of Mass.

[73] Assignee: Compaq Computer Corporation, Houston, Tex.

[*] Notice: This patent is subject to a terminal disclaimer.

[21] Appl. No.: 09/203,417

[22] Filed: Dec. 2, 1998

Related U.S. Application Data

[63] Continuation of application No. 08/979,376, Nov. 26, 1997, Pat. No. 5,886,862.

[51] Int. Cl.$^6$ .................................................. H02H 9/00
[52] U.S. Cl. ......................... 361/56; 361/111; 361/115; 361/118
[58] Field of Search .............................. 361/56, 91, 111, 361/113, 115, 118

[56] References Cited

U.S. PATENT DOCUMENTS

| | | | |
|---|---|---|---|
| 5,530,612 | 6/1996 | Maloney | 361/56 |
| 5,561,577 | 10/1996 | Motley | 361/56 |
| 5,617,283 | 4/1997 | Krakauer et al. | 361/56 |

OTHER PUBLICATIONS

Maloney, et al., "Novel Clamp circuits for IC Power Supply Protection," EOS/ESD Symposium 95–1: 1.1.1–1.1.12, Sep. (1995).

Worley, E.R., et al., "Sub–micron Chip ESD Protection Schemes Which Avoid Avalanching Junctions," EOS/ESD Symposium 95–13: 1.2.1–1.2.8, Sep. (1995).

Circuit in PD91–0213, p. 1, (1995).

Cicuit in PCI Bridge, pp. 1–2, (1995).

*Primary Examiner*—Stephen W Jackson
*Attorney, Agent, or Firm*—Sharp, Comfort & Merrett, P.C.

[57] ABSTRACT

An electrostatic discharge protection system provides electrostatic discharge protection for an integrated circuit having a package and a semiconductor device installed within the package. The package includes a first pin, a second pin and a reference pin. The semiconductor device includes a first conductor that connects with the first pin, a second conductor that connects with the second pin, and a reference conductor that connects with the reference pin. The integrated circuit operates within one of a normal operating mode and a power conservation mode when the first and second pins receive a power supply signal. The electrostatic discharge protection system includes a first protection device that detects and couples electrostatic discharge events from the first conductor to the reference conductor by reference to a voltage potential difference between the second conductor and the reference conductor. The electrostatic discharge protection system further includes a second protection device that detects and couples electrostatic discharge events from the second conductor to the reference conductor by reference to a voltage potential difference between the first conductor and the reference conductor. The first and second protection devices are disabled from detecting and coupling electrostatic discharge events when the first and second pins receive the power supply signal regardless of whether the integrated circuit is operating in the normal operating mode or the power conservation mode.

33 Claims, 4 Drawing Sheets

CROSS-REFERENCED ELECTROSTATIC DISCHARGE PROTECTION SYSTEMS AND METHODS FOR POWER SUPPLIES

RELATED APPLICATIONS

This application is a continuation of Ser. No. 08/979,376 filed Nov. 26, 1997, now U.S. Pat. No. 5,886,862 the entire teachings of which are incorporated herein by reference.

BACKGROUND OF THE INVENTION

Electrostatic discharge (ESD) represents an on-going threat to electronic systems, especially integrated circuits (IC) in which a semiconductor device is housed within an IC package. When an IC is exposed to an ESD event, an accumulation of static electricity moves from an external surface to the semiconductor device within the IC package, through one or more of its pins. Common metal-oxide semiconductor field-effect transistors (MOSFETs) and complementary metal-oxide semiconductor (CMOS) devices, which are formed from so called N-type material, P-type material, and insulating material (e.g., thin insulating oxides), are especially vulnerable to ESD. In particular, ESD can cause internal local heating that melts or fractures dielectric silicon oxide that insulates gates from other internal structures, resulting in permanent damage to the IC. Furthermore, ESD can cause drain to source shorts across MOSFET channels (i.e., second breakdown).

After an IC is manufactured and before it is installed on a circuit board, the IC is very susceptible to ESD damage. Conventional procedures for protecting ICs from ESD include making surfaces on shipping containers conductive to prevent or dissipate electrostatic charge buildup, grounding work surfaces, requiring handlers to wear grounded conductive wrist straps and clothing, and maintaining environmental conditions such as humidity and air ionization at levels that reduce the opportunity for electrostatic charge accumulation.

As a further safeguard, the typical IC includes ESD protection circuits that help to insulate more sensitive circuits within the semiconductor device from damage by ESD events. Generally, such ESD protection devices or circuits are located within the semiconductor device itself in close proximity to pads that are used to electrically connect the semiconductor device to the pins of the IC package.

ESD protection diodes and grounded-gate transistors are examples of conventional ESD protection devices. When an electrostatic charge is placed on an input/output (I/O) pin of the IC, i.e., a pin that receives an information bearing I/O signal, the ESD protection diode or grounded-gate transistor shunts the charge from the I/O pin, away from the circuits to be protected, to other areas of the IC such as a power supply pin or a ground pin of the IC.

An ESD protection circuit, which has been used to protect an IC from electrostatic discharge events occurring on an I/O pin, has the ability to disable itself when the IC is powered up. This ESD protection circuit (hereinafter called the "I/O pin protection circuit") has a large N-channel transistor interconnected between the I/O pin and a ground or reference pin, and an inverter (formed by two transistors) having an output that is connected with a gate of the N-channel transistor and an input connected with a power supply pin. If a substantial electrostatic charge is placed on the I/O pin when the IC is not powered up (i.e., when no power supply signal is received by the power supply pin), the large N-channel transistor turns on to provide a pathway between the I/O pin and the reference pin to dissipate the charge. When the IC is powered up (i.e., when a power supply signal is received by the power supply pin), the I/O pin protection circuit is disabled thereby enabling the other circuits of the IC to operate normally.

Another ESD protection circuit (hereinafter called the "power supply pin protection circuits") protects an IC from ESD events occurring on either an I/O power supply pin or a. internal power supply pin. The power supply pin protection circuit includes a first ESD protection device interconnected between the I/O power supply pin and a reference pin to direct electrostatic charge away from drive circuits that are powered via the I/O power supply pin through an I/O conductor $Vdd_x$. The power supply pin protection circuit further includes a second ESD protection device interconnected between the internal power supply pin and the reference pin to direct electrostatic charge away from internal (non-drive) circuits that are powered by the internal power supply pin through an internal power conductor $Vdd_i$. The capacitance of the conductor $Vdd_i$ is higher than that of the conductor $Vdd_x$ such that, when the IC is powered up, the power supply signal carried through the conductor $Vdd_i$ is more noise filtered than the power supply signal carried through the conductor $Vdd_x$. Accordingly, the power supply signal received by the internal circuits is less noisy than the power supply signal received by the drive circuits. When the IC is powered up, the first and second ESD protection devices of the power supply pin protection circuit detect the same power supply signal and are both disabled. When the IC is not powered up (i.e., when neither power supply pin receives a power supply signal), the first and second ESD protection devices operate to detect ESD events by reference to voltages between the power supply pins and the reference pin.

SUMMARY OF THE INVENTION

Some electronic products, such as portable computers and games, switch between a normal operating mode and a power conservation mode or sleep mode. Typically, ICs that support sleep modes have separate power supply pins for separately receiving a constant power supply signal and a sleep mode power supply signal. When both the constant and sleep mode power supply signals have a high logic level, sleep mode ICs operate in normal operating mode. When the constant power supply signal remains at a high logic level but the sleep mode power supply signal drops to a low logic level, sleep mode ICs are in a sleep mode. In sleep mode, some circuits (e.g., input and drive circuits) remain powered and operational to receive commands to exit from sleep mode, for example, and other circuits (e.g., internal. logic and processing circuits) are powered down and turned off. This system enables the ICs to conserve power during sleep mode. Furthermore, sleep mode ICs generally re-enter normal operating mode more quickly from sleep mode than from a completely powered down state. In particular, a processor with a sleep mode feature may skip certain self-test or initialization procedures when returning to normal operating mode from sleep mode.

The previously-described conventional power supply pin protection circuit is not suitable for ICs with a sleep mode feature. Recall that the power supply pin protection circuit has a first ESD protection device that is interconnected between an I/O supply pin and a reference pin and detects ESD events based on voltages on the internal power supply pin and the I/O power supply pin. If the I/O power supply pin receives a constant power supply signal for powering drive circuits of the sleep mode IC, and if the internal power supply pin receives a sleep mode power supply signal having a low logic level, the power supply pin protection circuit will detect the voltage difference between the pins as an ESD event and thus shunt the constant power supply signal to the reference pin. Such operation is unacceptable.

The present invention protects an IC against ESD events occurring on a power supply pin, which is intended to receive a constant power supply signal, by splitting the pin into two pins, i.e., two constant power supply pins, that both receive the constant power supply signal typically for powering the IC's I/O and drive circuits. The invention provides ESD protection against ESD events occurring on the pins when the IC is not powered up (e.g., when the IC is handled prior to its installation in a circuit board). When the IC is powered up, ESD protection is disabled. While the IC receives the constant power supply signal, ESD protection will not be inadvertently enabled (e.g., due to a drop in logic level of a sleep mode power supply signal) because the constant power supply pins receive the same power supply signal.

An electrostatic discharge protection system embodying the present invention provides electrostatic discharge protection for an integrated circuit having a package and a semiconductor device installed within the package. The package includes a first pin, a second pin and a reference pin. The semiconductor device includes a first conductor that connects with the first pin, a second conductor that connects with the second pin, and a reference conductor that connects with the reference pin. The integrated circuit operates within one of a normal operating mode and a power conservation mode when the first and second pins receive a power supply signal. In most cases, one or both of the first and second conductors are used to supply power to input and processing circuits that enable the integrated circuit to receive signals even when in sleep mode. The electrostatic discharge protection system includes a first protection device that detects and couples electrostatic discharge events from the first conductor to the reference conductor by reference to a voltage potential between the second conductor and the reference conductor. The electrostatic discharge protection system further includes a second protection device that detects and couples electrostatic discharge events from the second conductor to the reference conductor by reference to a voltage potential between the first conductor and the reference conductor. The first and second protection devices are disabled from detecting and coupling electrostatic discharge events when the first and second pins receive the power supply signal regardless of whether the integrated circuit is operating in the normal operating mode or the power conservation mode.

Another electrostatic discharge protection system embodying the present invention protects an integrated circuit against ESD events occurring on multiple pins that are connected respectively to power multiple drive circuits. In this way, separate pins are provided for the drive circuits and the internal logic circuits to insulate the internal circuits from voltage transients created by the relatively current-hungry drive circuits, and then multiple drive circuit power pins are provided to enable ESD protection for those pins. The integrated circuit has a package and a semiconductor device installed within the package. The package includes a first pin, a second pin and a reference pin. The semiconductor device includes a first conductor that connects with the first pin, a second conductor that connects with the second pin, a reference conductor that connects with the reference pin, a first drive circuit interconnected between the first conductor and the reference conductor, and a second conductor interconnected between the second conductor and the reference conductor. The electrostatic discharge protection system includes a first protection device that detects and couples electrostatic discharge events from the first conductor to the reference conductor, and thus away from the first drive circuit, by reference to a voltage potential difference between the second conductor and the reference conductor. A second protection device detects and couples electrostatic discharge events from the second conductor to the reference conductor, and thus away from the second drive circuit, by reference to a voltage potential difference between the first conductor and the reference conductor.

Splitting the pin that is intended to receive the constant power supply signal usually involves maintaining that pin and adding another pin, i.e., a dedicated pin, such that both pins will receive the constant power supply signal when the IC is powered up. If the IC already has two pins for receiving the constant power supply signal during sleep mode, there is no need to add a dedicated pin. Rather, the two existing pins can be used. In either case, the first protection device is interconnected between one of the constant power supply pins and a reference pin of the IC, and the second protection device is interconnected between the other constant power supply pin and the reference pin. The protection devices are configured to sense from each other's constant power supply pin.

Another ESD protection device can be interconnected between a power supply pin that receives a sleep mode power supply and a reference pin. Such an ESD protection device can be configured to sense one of the constant power supply pins so that it also remains disabled regardless of whether the IC is operating in the normal operating mode or the sleep mode.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
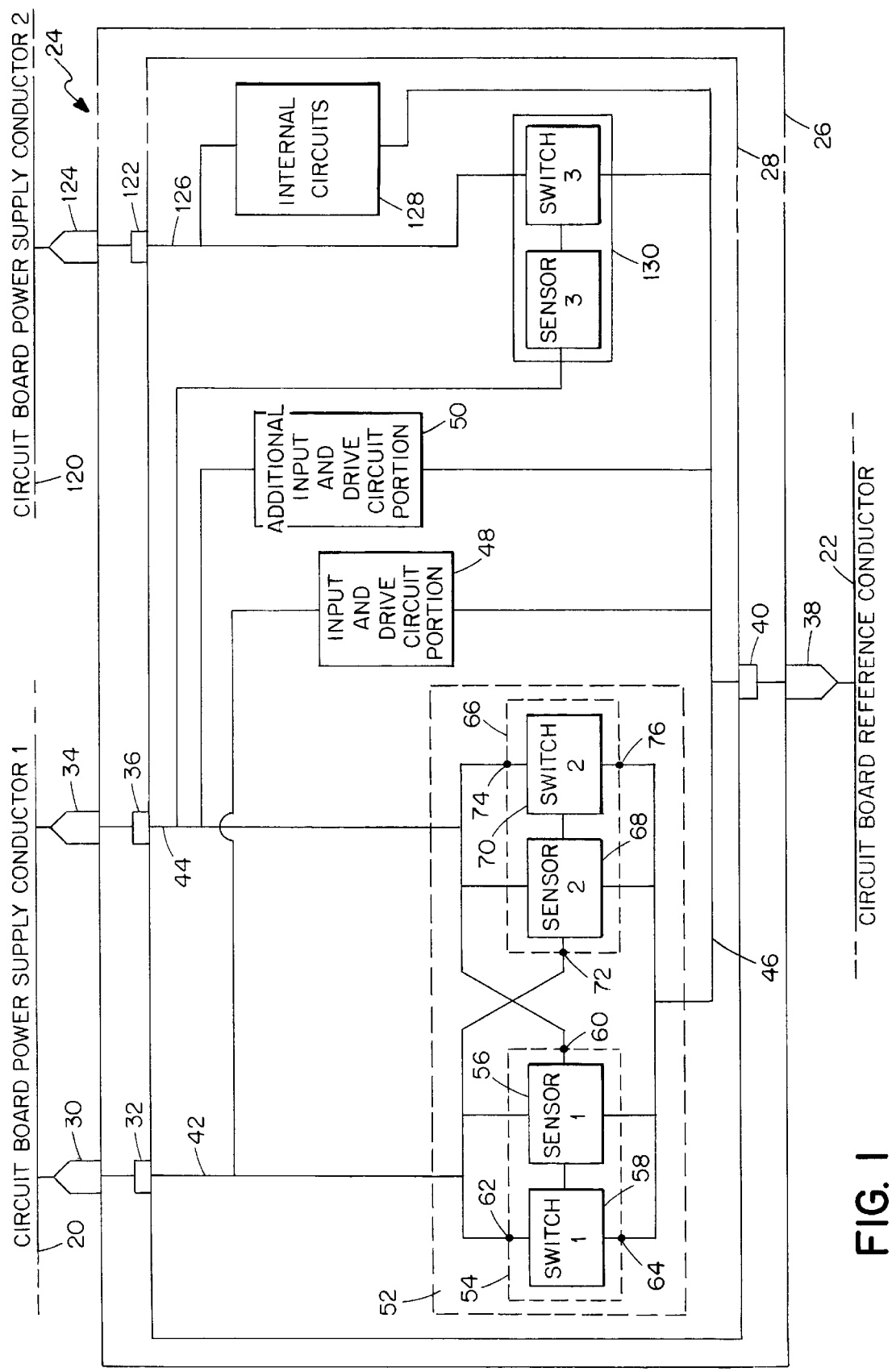
FIG. 1 is a block diagram of a portion of a circuit board having an IC that includes drive circuits that connect with multiple power supply pins and an ESD protection circuit, according to the invention.

FIG. 1 shows a portion of a circuit board having a first circuit board power supply conductor 20 (e.g., a power supply plane or etch disposed within the circuit board), a second circuit board power supply conductor 120 (e.g., another power supply plane or etch), a circuit board reference conductor 22 (e.g., a reference plane or etch), and an integrated circuit 24 interconnected between the circuit board power supply conductors and the reference conductor. The IC 24 includes an IC package 26 and a semiconductor device 28 housed within the package. The package includes a first power supply pin 30 and a second power supply pin 34 that respectively connect a first power supply pad 32 and a second power supply pad 36 on the semiconductor device with the first circuit board power supply conductor 20. The package further includes a third power supply pin 124 that connects a third power supply pad 122 on the semiconductor device with the second circuit board power supply conductor 120. The package also includes a reference pin 38 that connects a reference pad 40 on the semiconductor device with the circuit board reference conductor 22.

The power supply pad 32 connects to power a portion 48 of the input and drive circuits of the semiconductor device through a first power supply conductor 42. The power supply pad 36 connects with an additional portion 50 of the input and drive circuits through a second power supply conductor 44. The power supply pad 122 connects with internal logic and processing circuits 128 (hereinafter referred to as internal circuits) through a conductor 126. The reference pad 40 connects with the portions 48 and 50 of the input and drive circuits and the internal circuits 128 through a reference conductor 46.

The IC 24 further includes an ESD protection circuit 52 that connects with the conductors 42, 44 and 46. In particular, the ESD protection circuit includes a first ESD protection device 54 having a terminal 62 that connects with the conductor 42, a terminal 64 that connects with the reference conductor 46, and a control terminal 60 that connects with the conductor 44. The first ESD protection device 54 protects the IC against ESD events occurring on the power supply pin 30. The ESD protection circuit further includes a second ESD protection device 66 having a terminal 74 that connects with the conductor 44, a terminal 76 that connects with the reference conductor 46, and a control terminal 72 that connects with the conductor 42. The second ESD protection device 66 protects the IC against ESD events occurring on the power supply pin 34.

Each protection device includes a switch and a sensor. In particular, the first ESD protection device 54 includes a sensor 56 having an input that connects with the conductor 44 through control terminal 60, and an output. The first ESD protection device further includes a switch 58 that is interconnected between the conductors 42 and 46 through terminals 62 and 64, respectively, and that has a control input that connects with the output of the sensor 56. Similarly, the second ESD protection device includes a sensor 68 having an input that connects with conductor 42 through control terminal 72, and an output. The second ESD protection device further includes a switch 70 that is interconnected between the conductors 44 and 46 through terminals 74 and 76, respectively, and that has a control input that connects with the output of the sensor 68.

Prior to installation of the IC 24 in the circuit board (e.g., during transport or while the IC is being handled), the IC is very susceptible to ESD events. If an electrostatic charge is placed on the power supply pin 30, the first ESD protection device 54 provides a pathway for the charge to dissipate. That is, the first ESD protection device shunts or clamps the charge from the power supply pin 30 to the reference pin 38, and away from the input and drive circuits 48. More particularly, the sensor 56 senses the voltage of the power supply pin 34 and determines that the IC is not powered up, and provides a sensor signal to the switch 58 so that the switch 58 provides the pathway between the power supply pin 30 and the reference pin 38.

Similarly, if an electrostatic charge is placed on the power supply pin 34, the second ESD protection device 66 provides a pathway for the charge to dissipate. That is, the second ESD protection device shunts or clamps the charge from the power supply pin 34 to the reference pin 38, and away from the additional input and drive circuits 50. To this end, the sensor 68 senses the power supply pin 30 and determines that the IC is not powered up, and provides a sensor signal to the switch 70 so that the switch 70 provides the pathway between power supply pin 34 and the reference pin 38.

When the IC 24 is installed on a circuit board and the circuit board is powered up, the pathways provided by the ESD protection circuit are disabled. In particular, the sensor 56 senses a power supply signal having a high logic level (i.e., senses a potential difference between the power supply pin 34 connected with the circuit board power supply conductor 20 and the reference pin 38 connected with the circuit board reference conductor 22) and turns off the switch 58 to disable its pathway. Similarly, the sensor 68 senses the same power supply signal through the power supply pin 30 and turns off the switch 70 to disable its pathway. Once the pathways are disabled, the input and drive circuits 48, 50 can operate normally.

The IC 24 further includes an ESD protection device 130 that protects against ESD events occurring on the power supply pin 124. The ESD protection device 130 is interconnected between the conductor 126 and the reference conductor 46, and is configured to sense the voltage of one of the other power supply pins (e.g., pin 34) to determine whether the IC is powered up. The ESD protection device 130 includes a sensor and a switch similar to that of the ESD protection devices 54 and 66, and operates in a similar manner. Accordingly, when an electrostatic charge is applied to the pin 124, the ESD protection device 130 shunts the charge to the reference conductor 46 and the reference pin 38, and away from the internal circuits 128. However, when the IC is powered up, the power supply signal on pin 34 disables the ESD protection device 130, and the power supply signal on pin 124 is allowed to reach the internal circuits 128.

It should be understood that the IC 24 has sleep mode capabilities. In particular, the IC is configured to receive a constant power supply signal on pins 30 and 34, and a sleep mode power supply signal on pin 124. The constant power supply signal remains at a high logic level when the IC is powered up and operating in either a normal operating mode or a sleep mode. The sleep mode power supply signal has a high logic level when the IC is in normal operating mode, and a low logic level when the IC is in sleep mode.

When the IC is powered up in either normal operating mode or sleep mode, none of the ESD protection devices will inadvertently become enabled. In particular, each ESD protection device senses a power supply pin that receives the constant power supply signal. Since the constant power supply signal remains at a high logic level regardless of the mode of the IC, the ESD protection devices remain turned off. Accordingly, when the sleep mode power supply signal drops from a high logic level to a low logic level and the internal circuits turn off to conserve power, the ESD protection circuit 52 remains disabled and the input and drive circuits are unaffected (i.e., the input and drive circuits continue to receive the constant power supply signal). Thus, the IC's input circuits 48, 50 remain powered to enable the IC to receive external signals, such as a signal to wake-up from sleep mode.

The ESD protection circuit embodying the present invention can be incorporated into an IC having multiple power supply pins that are intended to receive a constant power supply signal, or an IC having a single power supply pin that is intended to receive a constant power supply signal. In the case of an IC with multiple power supply rails that are current isolated by respectively being connected with multiple power supply pins, it is a relatively straight-forward process to incorporate the ESD protection circuit 52 into the IC. In particular, the first ESD protection device 54 is added between the first power supply pin 30 and the reference pin 38, the second ESD protection device 66 is added between the second power supply pin 34 and the reference pin 38, and the inputs of the sensors of the ESD protection devices are connected such that the inputs sense electrical indications on each others power supply pin.

Figure 2:
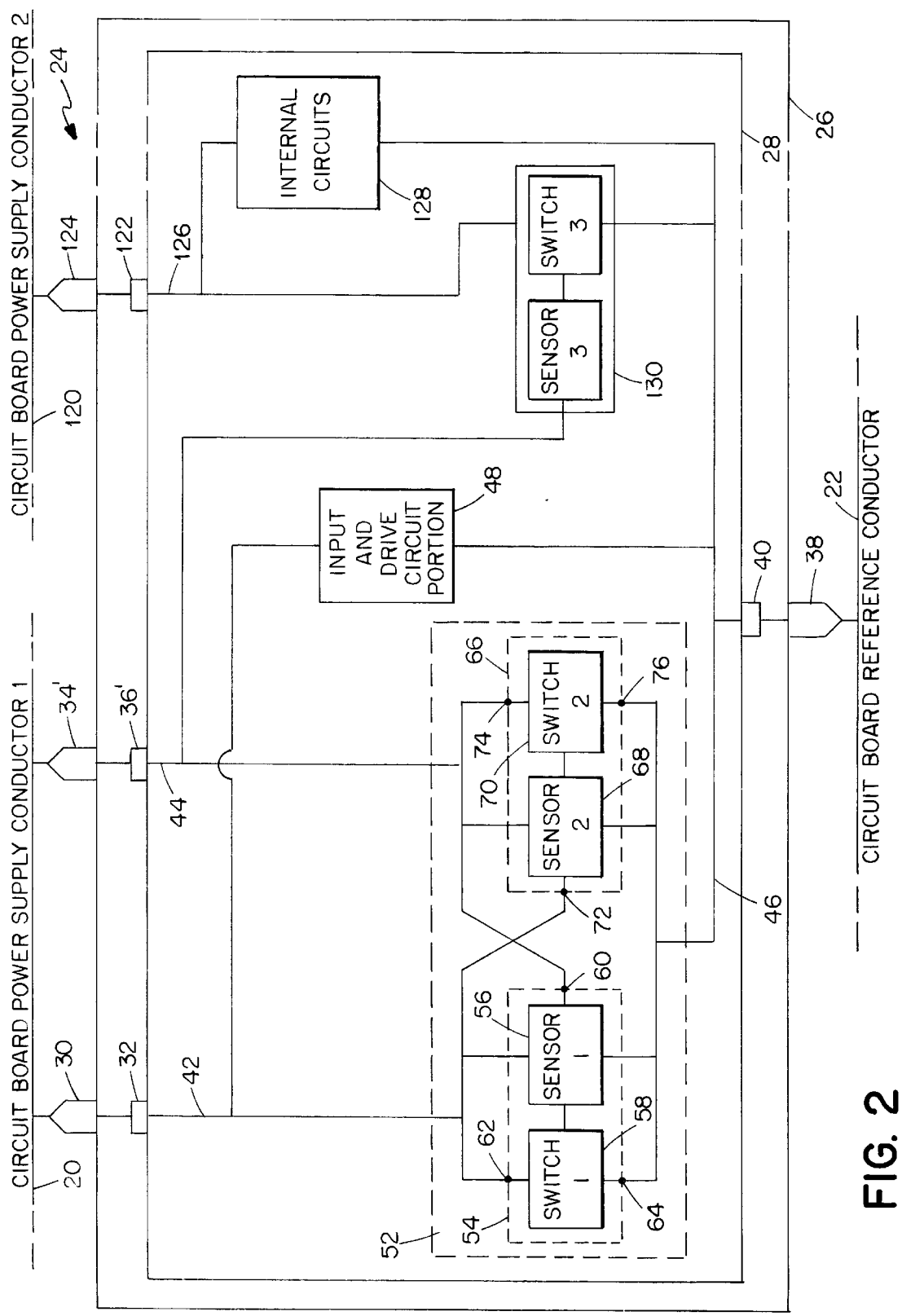
FIG. 2 is a block diagram of a portion of a circuit board having an IC that includes a drive circuit that connects with a single power supply pin and an ESD protection circuit, according to the invention.

In the case of an IC with a single power supply pin that connects with the drive and input circuits, another power supply pin is added. FIG. 2 is a diagram of a portion of a circuit board having an IC 24 with an added power supply pin 34' that connects the circuit board power supply conductor 20 with a power supply pad 36'. An ESD protection circuit is incorporated into the IC to protect against ESD events occurring on either the original power supply pin or the added pin. In particular, a first ESD protection device 54 is interconnected between the original power supply pin and the reference pin. The first ESD protection device is configured to sense from the newly added pin. A second ESD protection device 66 is interconnected between the newly added pin and the reference pin. The second ESD protection device is configured to sense from the original power supply pin. It should be understood that in this case, the pin 34' and the pad 36' are dedicated solely to providing a second route for the first ESD protection device to access the circuit board power supply conductor 20 electrically; the pin 34' is not used to supply power to the input and drive circuits 48 or the internal circuits 128 of the IC 26, but only used as a reference for ESD protection. It has been shown therefore that the present invention can be applied to ICs having only one power supply pin, intended to receive a constant power supply signal.

It should be understood that the IC 24 in FIG. 2 further includes a pin 124 that is intended to receive a sleep mode power supply signal having a high logic level when the IC is in normal operating mode and a low logic level when the IC is in sleep mode. To protect the pin 124, a separate ESD protection device 130 is interconnected between the pin 130 and the reference pin 38. The ESD protection device 130 senses from one of the pins receiving the constant power supply signal (e.g., pin 34).

Figure 3:
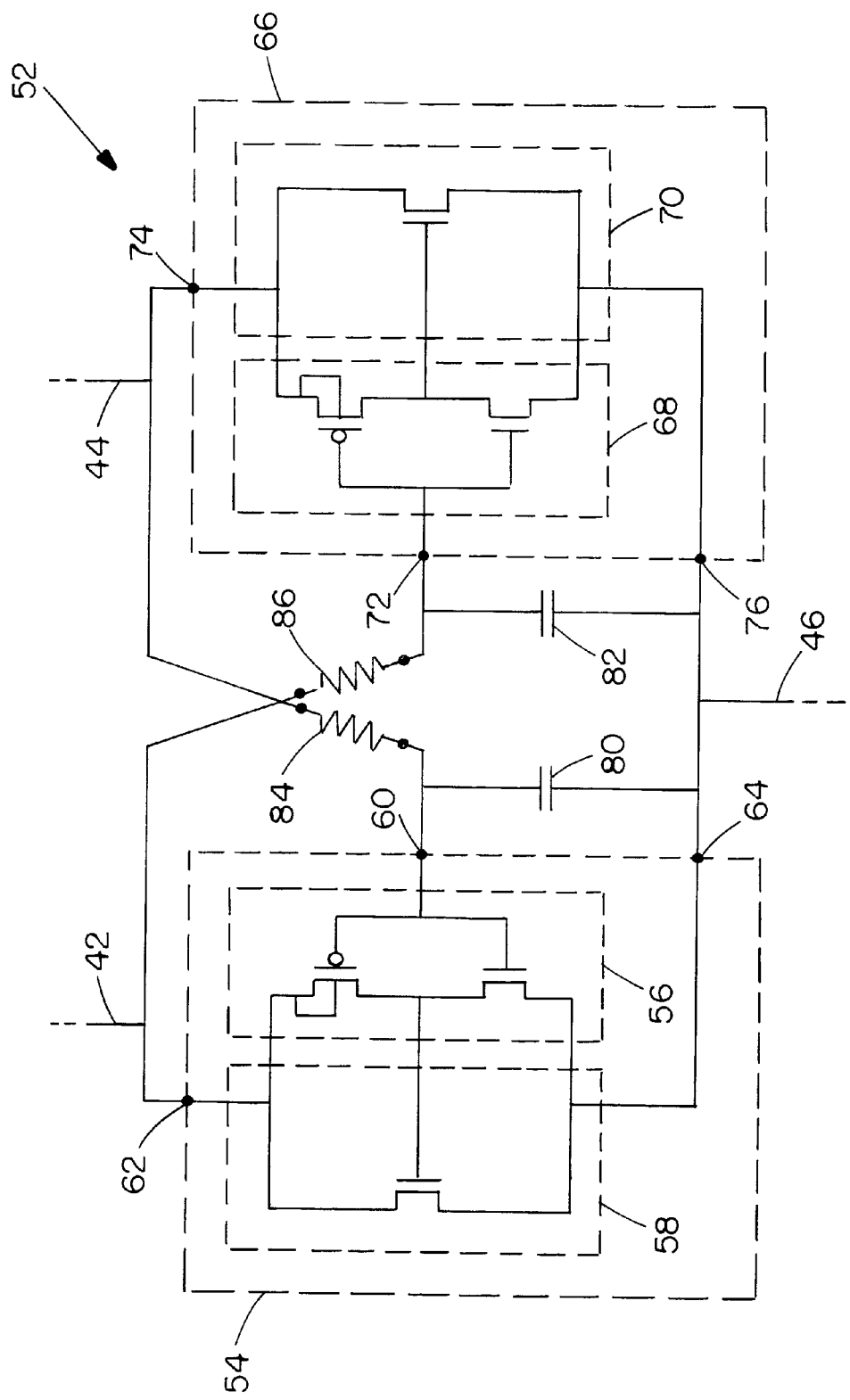
FIG. 3 is circuit diagram of the ESD protection circuit of FIGS. 1 and 2.

FIG. 3 is a circuit diagram of the ESD protection circuit 52 showing, by way of example, further details of the first and second protection circuits 54 and 66. In particular, the switch 58 is formed by an N-channel MOSFET having a drain connected with the conductor 42 through terminal 62, a source connected with the conductor 46 through terminal 64, and a gate. The sensor 56 is formed by a P-type metal oxide semiconductor (PMOS) transistor and an N-type metal oxide semiconductor (NMOS) transistor that are configured as an inverter. That is, the source of the PMOS transistor is connected with the conductor 42 through terminal 62, the source of the NMOS transistor 56 is connected with the conductor 46 through terminal 64, the drains of the PMOS and NMOS transistors are connected together to form an output of the inverter and are further connected to the gate of the N-channel MOSFET transistor, and the gates of the PMOS and NMOS transistors are connected together to form an input of the inverter and are further connected with the conductor 44 through terminal 60. The well of the PMOS transistor connects with terminal 62.

The sensor 68 and the switch 70 of the second ESD protection circuit 66 are implemented using transistors in a similar manner to that of the first ESD protection device 54. In particular, the sensor 68 is formed by a PMOS transistor and an NMOS transistor configured as an inverter having an input connected with the conductor 42 through terminal 72, and an output that provides a sensor signal to the switch 70. The well of the PMOS transistor connects with terminal 74. The switch 70 is formed by an N-channel MOSFET having a drain connected with the conductor 44 through terminal 74, a source connected with the conductor 46 through terminal 76, and gate connected with the output of the inverter.

The N-channel transistors forming the switches 58 and 70 are preferably larger than the transistors that form the inverters. Each N-channel transistors should be sized so that it can accommodate shunting of an electrostatic charge from a power supply pin to a reference pin before the charge generates a voltage level on the power supply pin that can damage other circuits.

When an electrostatic charge is applied to the power supply pin 30 connected with the conductor 42 (e.g., during handling of the IC prior to installation of the IC 24 on a circuit board), the PMOS transistor of the sensor 56 turns on and raises the voltage on the gate of the N-channel MOSFET transistor of the switch 58. If the electrostatic charge is large enough, the transistor will turn on and provide a pathway that shunts the charge from the power supply pin 30 to the conductor 46 and the reference pin 38. As a result, the input and drive circuits 48 that are connected with the power supply pin 30 through the conductor 42 are protected from the electrostatic charge. The ESD protection circuit operates in a similar manner (using the ESD protection device 66) to protect the IC against ESD events occurring on the other power supply pins 34 (FIG. 1) or 34' (FIG. 2).

It should be understood that, when an ESD event occurs on a power supply pin, the N-channel transistor interconnected between the power supply and reference pins provides a shunt before the voltage between the power supply and reference pins reaches the transistor's trigger voltage, i.e., the voltage required to activate the transistor when the transistor's gate is at zero volts. In particular, the inverter that senses the power supply pin raises the gate voltage of the transistor above the transistor's threshold voltage (turning on the transistor) well before the voltage between the power supply and reference pins reaches the trigger voltage. Accordingly, current flows from the power supply pin to the reference pin in an orderly fashion, and potentially destructive stresses on the device are reduced.

When the IC 24 is installed in a circuit board and powered up, the circuit board power supply conductor 20 provides a power supply signal through the power supply conductors 42 and 44 that turns off the PMOS transistors of the sensors 56 and 68 (see FIG. 3), and turns on the NMOS transistors of the sensors 56 and 68. Because the drains of the NMOS transistors are connected with the reference conductor 46 that further connects with the circuit board reference conductor 22, a voltage having a low logic level (zero volts) is provided to the gates of the N-channel MOSFET transistors of switches 58 and 70. Accordingly, the N-channel MOSFET transistors turn off such that ESD protection for the power supply pins 30 and 34 is disabled, and such that the other circuits of the IC 24 can operate normally.

The ESD protection circuit 52 preferably includes filters that increase noise immunity of the inputs of the ESD protection devices. In particular, the ESD protection circuit preferably includes a capacitor 80 interconnected between the input of the sensor 56 and the reference conductor 64, and a capacitor 82 interconnected between the input of the sensor 68 and the reference conductor 64. The capacitors 80 and 82 increase the capacitive coupling of the ESD protection device inputs and the reference conductor relative to the capacitive coupling of the inputs to each other. Accordingly, the likelihood of inadvertent disablement of the ESD protection circuit 52 during an ESD event is reduced. This feature of the invention can be described further by way of example with reference to FIG. 4.

Additionally, a resistor 84 is preferably interconnected between the control terminal 60 and the power supply conductor 44, and a resistor 86 is preferably interconnected between the control terminal 72 and the power supply conductor 42. The explicit resistors form RC circuits having increased time constants with capacitors 80 and 82 that further improve the noise immunity of the inputs of the ESD protection devices 54 and 66.

Figure 4:
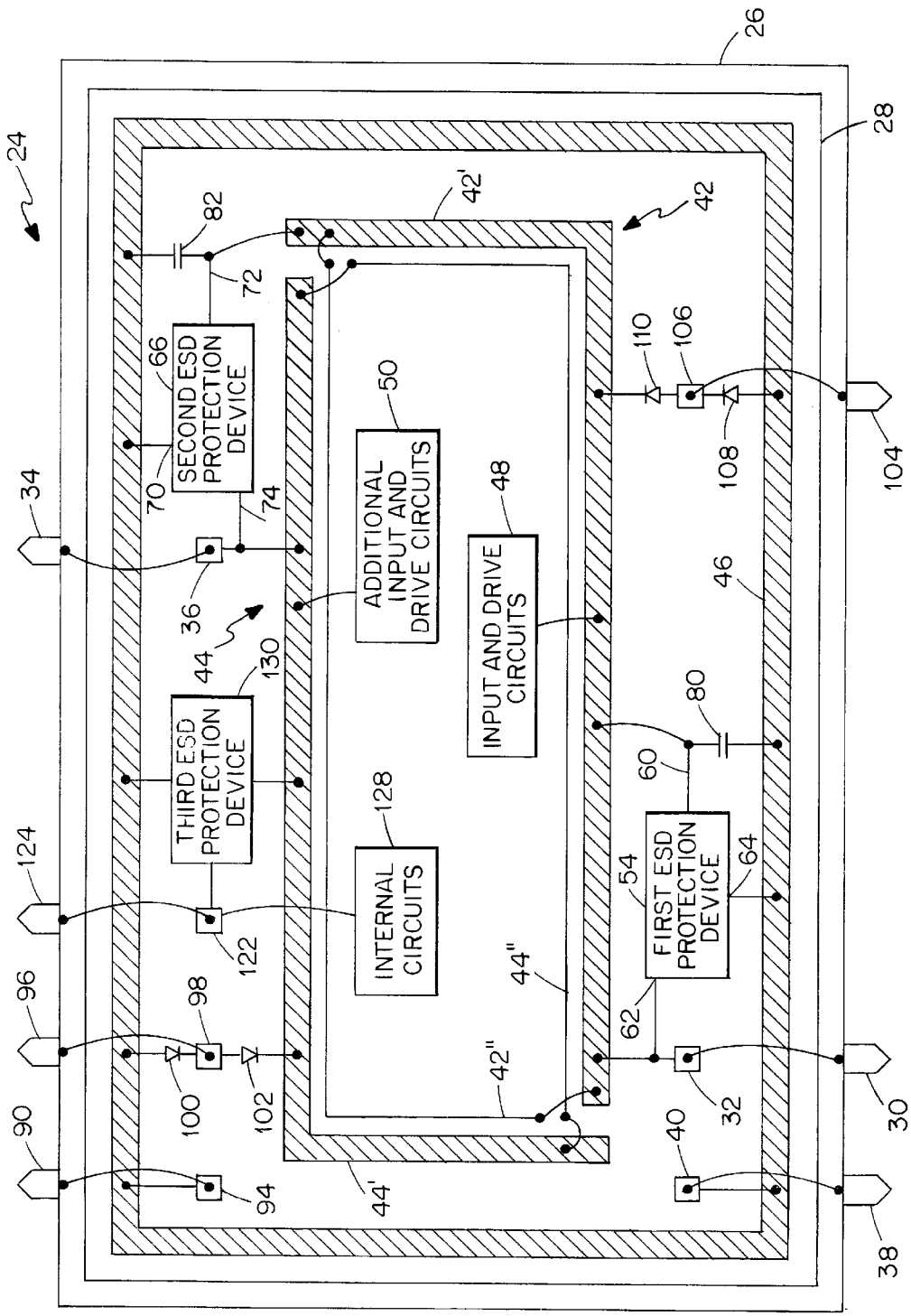
FIG. 4 is a block diagram of a semiconductor device having power supply and reference conductors and an ESD protection circuit, according to the invention.

FIG. 4 shows a possible layout of power supply conductors 42 and 44 and reference conductor 46 within the semiconductor device 28 of the IC 24. The reference conductor 46 is disposed along a perimeter of the semiconductor device and the power supply conductors are disposed within the reference conductor. Pads of the semiconductor device are positioned in a ring (that is not necessarily circular in shape) between the reference and power supply conductors.

The power supply conductor 42 includes a thick portion 42' and a narrow portion 42". Similarly, the power supply conductor 44 includes a thick portion 44' and a narrow portion 44". The thick portion 42' of the power supply conductor 42 runs adjacent and parallel to the narrow portion 44" of the power supply conductor 44. Similarly, the thick portion 44" of the power supply conductor 44 runs adjacent and parallel to the narrow portion 42" of the power supply conductor 42. The input of each protection device can connect with either a narrow portion or a thick portion of a power supply conductor. By way of example, the input 60 of the first ESD protection device 54 senses electrical indications on the power supply pin 34 through the narrow portion 44", the thick portion 44' and the power supply pad 36. Also by way of example, the input 72 of the second ESD protection device 66 senses electrical indications on the power supply pin 30 through the thick portion 42' and the power supply pad 32.

In the IC shown in FIG. 4, capacitive coupling exists between the narrow portion 42" of power supply conductor 42 and the thick portion 44' of power supply conductor 44, and between the narrow portion 44" of power supply conductor 44 and the thick portion 42' of power supply conductor 42. The capacitors 80 and 82 reduce the likelihood that an ESD event on a power supply pin will inadvertently disable the ESD protection circuit through such capacitive coupling. For example, without the capacitors 80 and 82, a sudden and substantial electrostatic charge placed on the power supply pin 30 and thus the thick portion 42' (through the pad 32) could raise the logic level sensed by the input 60 of the first ESD protection device 54 because of the capacitive coupling between power supply portions 42' and 44". In particular, the input 60 senses from the narrow portion 44" which is capacitively coupled with the thick portion 42' of the power supply conductor 42 receiving the ESD. If the logic level of the input 60 is raised high enough, the first ESD protection device 54 will be disabled and the electrostatic charge will be allowed to pass into the internal circuits of the semiconductor device. However, with capacitor 80 in place, the likelihood of such an inadvertent raising of the logic level at the input 60 is reduced. Although the input 72 of the second ESD protection device senses from the thick portion 42' of the power supply conductor 42, the second ESD protection circuit 70 preferably includes a capacitor 82 to reduce the likelihood of an inadvertent raising of the logic level at the input 72.

The filtering capacitors 80 and 82 are preferably disposed near the control terminals of the ESD protection devices to enhance the natural coupling. The capacitors can be formed by a gate oxide. Preferably, the capacitors are formed by reversed-biased diffusion junctions. The diffusion junctions provide some advantages over using gate oxide. For example, diffusion junctions generally are not subject to as many complementary metal-oxide semiconductor (CMOS) process restrictions and are thus easier to incorporate into an IC. Furthermore, capacitance provided by diffusion junctions is greatest at zero bias, i.e., when the IC is not powered up and when the capacitance is most needed.

Also shown in FIG. 4 is a second reference pin 90 that connects with the reference conductor 46 through a second reference pad 94. When the IC is installed on a circuit board, the second reference pin 90 provides additional path between the external circuit board reference conductor 22 and the reference conductor 46.

Furthermore, the IC 24 preferably includes other ESD protection circuits that protect I/O pins of the IC. In particular, an I/O pin 96 connects with internal circuits of the semiconductor device 28 through an I/O pad 98. The I/O pad 98 is ESD protected using an ESD protection diode 100 interconnected between the pad 98 and the reference conductor 92, and an ESD protection diode 102 interconnected between the pad 98 and the power supply conductor 44. Similarly, an I/O pin 104 connects with the internal circuits of the semiconductor device 28 through an I/O pad 106. The I/O pad 106 is ESD protected using an ESD protection diode 108 interconnected between the pad 106 and the reference conductor 46, and an ESD protection diode 110 interconnected between the pad 106 and the power supply conductor 42. Although the IC shown in FIG. 4 uses ESD protection diodes to protect against ESD events occurring on the I/O pins, other ESD protection devices could be used such as silicon controlled rectifiers (SCRs), grounded-gate NMOS devices, or gate-coupled NMOS devices.

It should be understood that the ESD protection circuit provides ESD protection against ESD events directly occurring on the power supply pins 30 and 34. That is, ESD protection is provided against electrostatic charge directly applied to the power supply pins. It should be understood further that the ESD protection circuit provides protection against ESD events occurring on the I/O pins, which receive input signals from outside the IC. For example, an electrostatic charge applied to the I/O pin 96 will dissipate onto the power supply conductor 44 and the power supply pin 34, through the ESD protection diode 102. If the electrostatic charge on the power supply conductor 44 is substantial, the second ESD protection device 66 will dissipate the charge further onto the reference conductor 46 and the reference pin 38. Similarly, an electrostatic charge placed on the I/O pin 104 will dissipate onto the power supply conductor 42 and the power supply pin 30 through the ESD protection diode 110, and possibly further onto the reference conductor and reference pin through the first ESD protection device 54. Accordingly, the ESD protection circuit 52 provides ESD protection to the IC by further dissipating electrostatic charge that originates on an I/O pin and indirectly reaches a power supply pin.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

For example, FIG. 4 illustrates a possible layout of the power supply and reference conductors and pads of the semiconductor device. The invention can be used with other layouts and is not limited to the layout of FIG. 4. Although FIG. 4 shows that the power supply pins are not adjacent to each other, positioning the pins away from each other, such as on different edges of the IC package reduces the likelihood that multiple ESD events will occur simultaneously, and thus lessen the possibility of damage to the IC. Hence, the power supply pins of the IC are preferably spaced far apart from each other.

Additionally, it should be understood that the present invention is not limited to protecting power supply pins of sleep mode ICs. The invention can be used in ICs without a sleep mode function. In particular, the invention can be used to protect an IC having multiple power supply pins that carry a constant power signal to respective drive and input circuits.

Furthermore, it should be understood that the inverters forming the sensors of the ESD protection devices can be formed by components other than the PMOS and NMOS transistor pairs shown in FIG. 3. In particular, other standard inverter circuits are suitable for use by the invention.

Similarly, it should be understood that the switches of the ESD protection devices can be formed by components other than the N-channel transistors shown in FIG. 3. In particular, other standard switch circuits are suitable for use by the invention such as PMOS devices or low-voltage triggered SCRs.

Although the each power supply conductor and reference conductor is shown as being connected with a single pin, it should be understood that each conductor can be connected with more than one pin. For example, there can be multiple power supply pins connected with the power supply conductor 126 shown in FIG. 1. As a further example, there can be multiple reference pins connected with the reference conductor 46.

Also, it should be understood that the above-described power supply signals are different from I/O signals. I/O signals are information bearing signals used for the primary purpose of carrying data. In contrast, power supply signals are used for the primary purpose of providing power to the ICs.

It should be further understood that the ESD protection circuit can be incorporated with other circuits thereby forming an ESD protection system. In one case, the ESD protection system includes the ESD protection circuit 52 and additional ESD protection circuitry (e.g., ESD protection device 130). In another case, the ESD protection system is formed by the IC itself including non-protection circuits such as the drive circuits of the IC.

What is claimed is:

1. An electrostatic discharge protection system for an integrated circuit having a package and a semiconductor device installed within the package, wherein the package includes a first pin, a second pin and a reference pin, wherein the semiconductor device includes a first conductor that connects with the first pin, a second conductor that connects with the second pin, a reference conductor that connects with the reference pin, a first drive circuit connected with the first conductor, and a second drive circuit connected with the second conductor, the electrostatic discharge protection system comprising:

a first protection device that detects and couples electrostatic discharge events from the first conductor to the reference conductor, and away from the first drive circuit, by reference to a voltage potential difference between the second conductor and the reference conductor; and a second protection device that detects and couples electrostatic discharge events from the second conductor to the reference conductor, and away from the second drive circuit, by reference to a voltage potential difference between the first conductor and the reference conductor.

2. The electrostatic discharge protection system of claim 1 wherein the first and second pins are power supply pins for receiving a power supply signal, wherein the first and second protection devices are disabled when the power supply signal is received by the first and second pins, and wherein the first and second protection devices are enabled when no power supply signal is received by the first and second pins.

3. An electrostatic discharge protection system for an integrated circuit having a package and a semiconductor device installed within the package, wherein the package includes a power pin, an exclusively ESD reference pin, and a circuit reference pin, wherein the semiconductor device includes a power conductor that connects with the power pin, an exclusively ESD reference conductor that connects with the exclusively ESD reference pin, a circuit reference conductor that connects with the circuit reference pin, and a drive circuit connected with the power conductor and the circuit reference conductor, the electrostatic discharge protection system comprising:

a first protection device that detects and couples electrostatic discharge events from the power conductor to the circuit reference conductor, and away from the drive circuit, by reference to the exclusively ESD reference conductor; and a second protection device that detects and couples electrostatic discharge events from the exclusively ESD reference conductor to the circuit reference conductor by reference to the power conductor.

4. The electrostatic discharge protection system of claim 3 wherein the power and exclusively ESD reference pins are power supply pins for receiving a power supply signal, wherein the first and second protection devices are disabled when the power supply signal is received by the power and exclusively ESD reference pins, and wherein the first and second protection devices are enabled when no power supply signal is received by the power and exclusively ESD reference pins.

5. A method for protecting an integrated circuit from electrostatic discharge, the integrated circuit having a package and a semiconductor device installed within the package, wherein the package includes a first pin, a second pin and a reference pin, wherein the semiconductor device includes a first conductor that connects with the first pin, a second conductor that connects with the second pin, a reference conductor that connects with the reference pin, and wherein the integrated circuit operates within one of a normal operating mode and a power conservation mode when the first and second pins receive a power supply signal, the method comprising the steps of:

coupling electrostatic discharge events from the first conductor to the reference conductor through a first pathway according to a voltage potential difference between the second conductor and the reference conductor;

coupling electrostatic discharge events from the second conductor to the reference conductor through a second pathway according to a voltage potential difference between the first conductor and the reference conductor; and disabling the first and second pathways when the first and second pins receive the power supply signal when the integrated circuit is operating in one of the normal operating mode and the power conservation mode.

6. The method of claim 5 wherein the semiconductor device further includes a first drive circuit connected with the first conductor, and a second drive circuit connected with the second conductor; wherein the step of coupling electrostatic discharge events from the first conductor includes the step of establishing the first pathway to direct charge away from the first drive circuit; and wherein the step of coupling electrostatic discharge events from the second conductor includes the step of establishing the second pathway to direct charge away from the second drive circuit.

7. The method of claim 5 wherein the step of disabling includes the step of:

generating a first deactivation signal and a second deactivation signal in response to the first and second pins receiving the power supply signal;

deactivating the first pathway in response to the first deactivation signal; and deactivating the second pathway in response to the second deactivation signal.

8. The method of claim 7 wherein the step of generating includes the step of:

receiving a first input signal on an input of a first inverter in response to the second pin receiving the power supply signal, and providing the first deactivation signal on an output of the first inverter; and receiving a second input signal on an input of a second inverter in response to the first pin receiving the power supply signal, and providing the second deactivation signal on an output of the second inverter.

9. The method of claim 8 wherein a first transistor provides the first pathway, wherein the step of deactivating the first pathway includes applying the first deactivation signal to the first transistor to place the first transistor in a non-biased state, wherein a second transistor provides the second pathway, and wherein the step of deactivating the second pathway includes applying the second deactivation signal to the second transistor to place the second transistor in a non-biased state.

10. The method of claim 7 wherein a first transistor provides the first pathway, wherein the step of deactivating the first pathway includes applying the first deactivation signal to the first transistor to place the first transistor in a non-biased state, wherein a second transistor provides the second pathway, and wherein the step of deactivating the second pathway includes applying the second deactivation signal to the second transistor to place the second transistor in a non-biased state.

11. The method of claim 5 wherein a first protection device provides the first pathway, wherein a second protection device provides the second pathway, and wherein the method the further comprises the step of:

reducing noise at an input of the first protection device; and reducing noise at an input of the second protection device.

12. The method of claim 11 wherein the step of reducing noise at the input of the first protection device includes the step of providing a high capacitance between the second conductor and the reference conductor adjacent the input of the first protection device; and wherein the step of reducing noise at the input of the second protection device includes the step of providing a high capacitance between the first conductor and the reference conductor adjacent the input of the second protection device.

13. An integrated circuit device comprising:

a first conductor coupled to a first pad;

a second conductor coupled to a second pad;

a reference conductor coupled to a reference pad;

a first drive circuit coupled to the first conductor;

a second drive circuit coupled to the second conductor;

a first protection device that detects and couples electrostatic discharge events from the first conductor to the reference conductor, and away from the first drive circuit, by reference to a voltage potential difference between the second conductor and the reference conductor; and a second protection device that detects and couples electrostatic discharge events from the second conductor to the reference conductor, and away from the second drive circuit, by reference to a voltage potential difference between the first conductor and the reference conductor.

14. The device of claim 13 wherein the first and second pads are power supply pads for receiving a power supply signal, wherein the first and second protection devices are disabled when the power supply signal is received by the first and second pins, and wherein the first and second protection devices are enabled when no power supply signal is received by the first and second pins.

15. The device of claim 13 wherein the first protection device comprises:

a sensor coupled between the second conductor and the reference conductor; and a switch coupled between the first conductor and the reference conductor, the switch being enabled and disabled by the sensor.

16. The device of claim 15 wherein the sensor comprises a CMOS inverter and the switch comprises a transistor with a control terminal coupled to an output of the CMOS inverter.

17. The device of claim 16 wherein the transistor comprises an field effect transistor with a gate coupled to an output of the CMOS inverter.

18. The device of claim 13 and further comprising a third protection circuit coupled to protect circuitry internal to the integrated circuit device.

19. The device of claim 13 wherein the integrated circuit device is mounted within a package and electrically coupled to pins of the package.

20. The device of claim 13 wherein the first and second conductors are current isolated from each other within the integrated circuit device.

21. The device of claim 13 and further comprising:

a first filter coupled to the first conductor to reduce noise on the first conductor; and a second filter coupled to the second conductor to reduce noise on the second conductor.

22. The device of claim 21 wherein the first filter includes a first capacitor coupled between the first conductor and the reference conductor, and wherein the second filter includes a second capacitor coupled between the second conductor and the reference conductor.

23. The device of claim 22 wherein the first protection circuit has a first control terminal coupled to the second conductor, wherein the first capacitor is disposed adjacent the first control terminal, wherein the second protection circuit has a second control terminal coupled to the first conductor, and wherein the second capacitor is disposed adjacent the second control terminal.

24. The device of claim 22 wherein each of the first and second capacitors includes gate oxide.

25. The device of claim 22 wherein each of the first and second capacitors is formed by a reverse-biased diffusion junction.

26. The device of claim 22 wherein the first filter further includes a first resistor coupled between the first capacitor and the first conductor, and the second filter further includes a second resistor coupled between the second capacitor and the second conductor.

27. An integrated circuit device comprising:

a power conductor coupled to power pad;

an exclusively ESD reference conductor coupled to an exclusively ESD reference pin;

a circuit reference conductor coupled to a circuit reference pin;

a drive circuit coupled to the power conductor and the circuit reference conductor;

a first protection device that detects and couples electrostatic discharge events from the power conductor to the circuit reference conductor, and away from the drive circuit, by reference to the exclusively ESD reference conductor; and a second protection device that detects and couples electrostatic discharge events from the exclusively ESD reference conductor to the circuit reference conductor by reference to the power conductor.

28. The device of claim 27 wherein the power and exclusively ESD reference pads are power supply pads for receiving a power supply signal, wherein the first and second protection devices are disabled when the power supply signal is received by the power and exclusively ESD reference pads, and wherein the first and second protection devices are enabled when no power supply signal is received by the power and exclusively ESD reference pads.

29. The device of claim 27 wherein the first protection device comprises:

a sensor coupled between the power conductor and the exclusively ESD reference conductor; and a switch coupled between the power conductor and the circuit reference conductor, the switch being enabled and disabled by the sensor.

30. The device of claim 27 wherein the second protection device comprises:

a sensor coupled between the power conductor and the exclusively ESD reference conductor; and a switch coupled between the exclusively ESD reference conductor and the circuit reference conductor, the switch being enabled and disabled by the sensor.

31. The device of claim 27 wherein the integrated circuit device is mounted within a package and is electrically coupled to pins of the package.

32. The device of claim 27 and further comprising:

a first filter coupled to the first conductor; and a second filter coupled to the second conductor.

33. The device of claim 32 wherein the first filter includes a first capacitor and wherein the second filter includes a second capacitor.

* * * * *